US009490753B1

(12) United States Patent
Kryshtopin

(10) Patent No.: US 9,490,753 B1
(45) Date of Patent: Nov. 8, 2016

(54) APPARATUSES AND SYSTEMS FOR A BIAS NETWORK WITH ACCURATE QUIESCENT CURRENT CONTROL

(71) Applicant: TRIQUINT SEMICONDUCTOR, INC., Hillsboro, OR (US)

(72) Inventor: Andriy Kryshtopin, Kirchseeon (DE)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/610,873

(22) Filed: Jan. 30, 2015

Related U.S. Application Data

(60) Provisional application No. 62/100,427, filed on Jan. 6, 2015.

(51) Int. Cl.
| | |
|---|---|
| H03F 3/04 | (2006.01) |
| H03F 3/16 | (2006.01) |
| H03F 1/02 | (2006.01) |
| H03F 3/21 | (2006.01) |
| H03F 3/193 | (2006.01) |

(52) U.S. Cl.
CPC ............ *H03F 1/0216* (2013.01); *H03F 3/193* (2013.01); *H03F 3/21* (2013.01); *H03F 2200/451* (2013.01)

(58) Field of Classification Search
USPC ................................. 330/285, 296, 277, 289
See application file for complete search history.

(56) References Cited

U.S. PATENT DOCUMENTS

| | | | | |
|---|---|---|---|---|
| 6,288,613 B1 * | 9/2001 | Bennett | ................... | H03F 1/306 330/277 |
| 7,839,217 B2 * | 11/2010 | Okuma | ................... | H03F 1/302 330/296 |
| 8,049,483 B2 * | 11/2011 | Yamamoto | .............. | G05F 3/185 323/313 |
| 2014/0167859 A1 * | 6/2014 | Bettencourt | .............. | G05F 3/26 330/296 |

OTHER PUBLICATIONS

Author Unknown, "Bias Circuit Design for Microwave Amplifiers," ECE145A/218A, UCSB/ECE, Prof. S. Long, Sep. 2, 2004, 14 pages.
Author Unknown, "SKY65124: WCMDA PA Bias Method for Lower Junction Temperature," Skyworks Solutions, Inc., Application Note, 2009, 5 pages.
Birkbeck, John D., "Design Challenges in HBT MMIC Amplifier Bias Circuits," Roke Manor Research Ltd., Jan. 10, 2003, 6 pages.
Dearn, Andrew et al., "A Universal GaAs HBT PA with Active Bias Circuitry, Covering 4.9-6 GHz," 12th Annual GAAS Symposium, Oct. 2004, Amsterdam, pp. 155-157.
Noh, Y.S. et al., "An Intelligent Power Amplifier MMIC Using a New Adaptive Bias Control Circuit for W-CDMA Applications," IEEE Journal of Solid-State Circuits, vol. 39, No. 6, Jun. 2004, pp. 967-970.
Yang, Youngoo, "Power Amplifier With Low Average Current and Compact Output Matching Network," IEEE Microwave and Wireless Components Letters, vol. 15, No. 11, Nov. 2005, pp. 763-765.

* cited by examiner

*Primary Examiner* — Hieu Nguyen
(74) *Attorney, Agent, or Firm* — Withrow & Terranova, P.L.L.C.

(57) ABSTRACT

Embodiments of apparatuses and systems for a bias network providing accurate quiescent current control are generally described herein. Other embodiments may be described and claimed.

22 Claims, 4 Drawing Sheets

APPARATUSES AND SYSTEMS FOR A BIAS NETWORK WITH ACCURATE QUIESCENT CURRENT CONTROL

CROSS-REFERENCE TO RELATED APPLICATION

The present application is a non-provisional application of and claims priority to U.S. Provisional Patent Application No. 62/100,427, filed Jan. 6, 2015, entitled "APPARATUSES AND SYSTEMS FOR A BIAS NETWORK WITH ACCURATE QUIESCENT CURRENT CONTROL," the disclosure of which is hereby incorporated by reference in its entirety for all purposes except for those sections, if any, that are inconsistent with this specification.

FIELD

Embodiments of the present invention relate generally to the field of circuits, and more particularly to a bias network to provide an accurate quiescent current control.

BACKGROUND

For efficiency-optimized mobile power amplifiers it is common to digitally adjust the driver or the final stage quiescent current (Iccq). Battery-operated devices only allow a limited voltage range of the governing digital-to-analog converter (DAC), for example, Vreg=0.1 V-2.9 V; typically with an accuracy of +/−0.1 V. Typical bias networks only use a fraction of the available voltage range (limited by doubled base-emitter voltage—about 2.5-2.7 V), for example, 2.9 V-2.5 V=0.4 V, which results in low control accuracy.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

For the purposes of the present disclosure, the term "or" is used as an inclusive term to mean at least one of the components coupled with the term. For example, the phrase "A or B" means (A), (B), or (A and B); and the phrase "A, B, or C" means (A), (B), (C), (A and B), (A and C), (B and C), or (A, B, and C).

Figure 1:
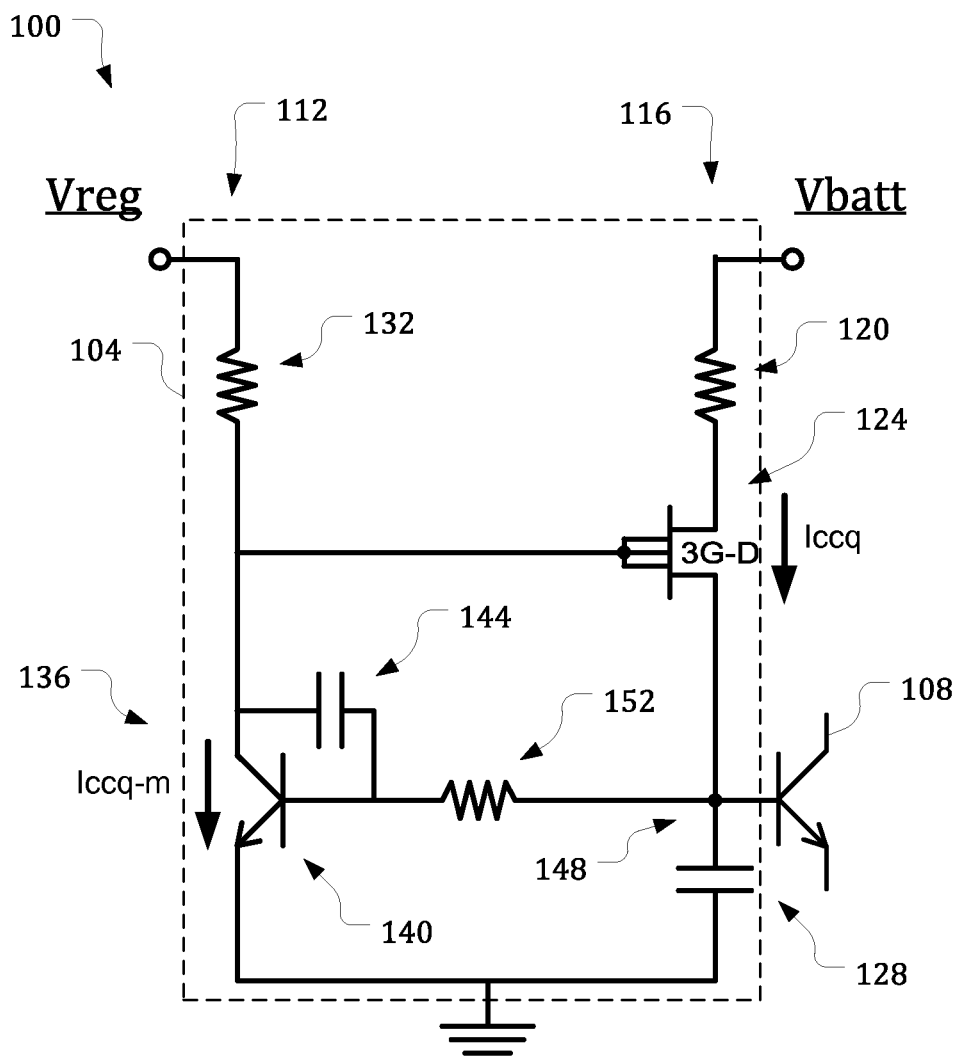
FIG. 1 is a schematic of a circuit including a bias network and a radio frequency transistor in accordance with various embodiments.

FIG. 1 illustrates a circuit 100 that includes a bias network 104 coupled with a radio frequency (RF) transistor 108 in accordance with various embodiments of the present invention. The RF transistor 108, which may be a heterojunction bipolar transistor (HBT), may be a driver or a final-stage transistor of a power amplifier.

The bias network 104 may be configured to receive an analog regulator voltage (Vreg) at a first branch 112, and a battery voltage (Vbatt) at a second branch 116. Vreg may be provided by a digital-to-analog converter (DAC) and Vbatt may be provided by a power source such as a battery. The DAC may be constructed using a complementary metal oxide semiconductor (CMOS) process that provides Vreg with an accuracy of ±100 mV.

The second branch 116 may include a resistor 120, a transistor 124, and a capacitor 128 coupled with each other as shown. The transistor 124 may be an emitter-follower or a source-follower. The first branch 120 may include a resistor 132 and a current mirror 136. The current mirror 136 may include a transistor 140, for example, an HBT, and a capacitor 144 coupled with a base and a collector of the transistor 140. The current mirror 136 may be same type of transistor as the RF transistor 108.

The current mirror 136 of the first branch 112 may be coupled with a node 148 of the second branch 116 through a resistor 152. In general, the transistor 124 may provide a quiescent current (Iccq), which may be copied by the current mirror 136 as a mirrored quiescent current (Iccq-m). Iccq may be the Iccq-m multiplied by Srf/Smir, where Srf is an emitter area of the RF transistor 108 and Smir is an emitter area of the mirror transistor. The current mirror 136 may provide the mirror current in order to set the Iccq through the RF transistor 108. The quiescent current may be proportional to the mirror current. The Iccq may be provided to a base of the RF transistor 108 at the node 148 as a steady state current set to keep the RF transistor 108 operating in an active mode. The Iccq may be controlled by Vreg.

Present bias circuits typically rely on a HBT as an emitter follower. In order to properly bias an RF transistor using an HBT emitter follower, the Vreg will need to be at least 2.5 V. Because typical DACs implemented in bias circuits have an upper range of approximately 2.9 V, the voltage regulation range is constrained to approximately 0.4 V.

Using a single gate D-FET instead of an HBT as a source follower may provide a proper bias to an RF transistor with a Vreg down to almost 0 V. However, the pinch-off voltage of a single-gate D-FET may be approximately −0.8 V. Thus, in order to shut off current from Vbatt to the base of an RF transistor, the Vreg may need a negative voltage, which is typically not available using CMOS processes. Thus, a single gate D-FET may leak current from Vbatt, which may be directly coupled with a power source of an implementing apparatus.

In order to facilitate a wide range of Vreg to be used to accurately bias the RF transistor 108, embodiments of the present disclosure provide a triple-gate depletion mode field effect transistor (D-FET) as the transistor 124. The three gates of the triple-gate D-FET may be coupled with a single gate electrode and controlled, electrically, as one gate. The three gates may include a single gate stacked on top of two vertical gates. However, in different embodiments different architectures may be used. A triple-gate D-FET may decrease transistor switching speed and change circuit performance (for example, providing very little current leakage when turned off). In some embodiments, the switching time may be changed by using a triple-gate transistor, as compared to a single-gate transistor.

By increasing the number of gates on the D-FET used as the transistor 124, the pinch-off voltage (dVp) is increased. With three or more gates, the D-FET may effectively switch off biasing in the temperature range of −30° C. to 90° C. and over process variation. Increasing the number of gates from one to three may allow reduction of Iccq current in the off state from 0.34 µA to 0.06 µA at Vreg of 0.1 V.

While the present embodiments are described with the transistor 124 being a triple-gate D-FET, other embodiments having other number of gates may also be used. For example, in some embodiments more than three gates may be used. However, the voltage regulation range may decrease with larger dVp.

In operation, using a triple-gate D-FET as the transistor 124 may allow Iccq to be controlled with Vreg that is below the 2.5 V limitation of previous bias networks and, in some embodiments, Iccq may be controlled with a Vreg down to approximately 0.7 V at a temperature range of −30 degrees C.-90 degrees C. The resulting voltage regulation range, assuming a maximum DAC voltage of 2.9 V, will therefore become approximately 2.2 V (2.9 V to 0.7 V). This larger Vreg range, as compared to previous bias circuits, may result in a higher potential accuracy of Iccq used to bias the RF transistor 108. Furthermore, the triple-gate D-FET may also increase the pinch off voltage, which may provide an ability to switch off the transistor 124 at a lower Vreg. This may provide the bias network 104 with the capability of shutting off the current from Vbatt to the base of the RF transistor 108 with a non-negative Vreg.

A typical BiHEMT process may provide a pinch-off voltage variation (dVpd) for D-FET devices of approximately ±200 mV. Such dVpd may, in some situations, provide unsatisfactory Iccq variation. Therefore, some embodiments may provide for process variation compensation by placing a compensating device with certain dVpd characteristic over process (e.g., a multi-gate D-FET current source) in parallel with the current mirror to steal a small amount of mirror current, for example, less than approximately 200 µA, with the value of stolen current depending on the dVp value. This is described in further detail below with respect to FIG. 2.

Figure 2:
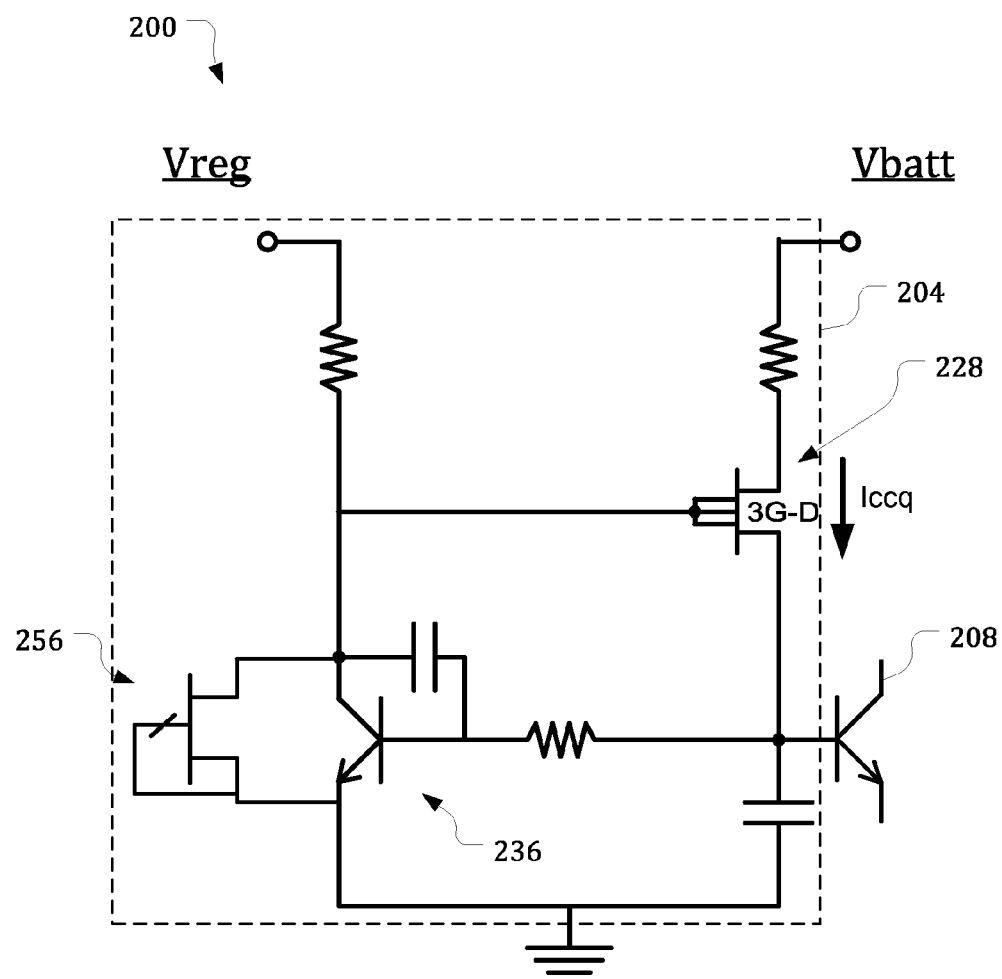
FIG. 2 is a schematic of another circuit including a bias network and a radio frequency transistor in accordance with various embodiments.

FIG. 2 illustrates a circuit 200 that includes a bias network 204 coupled with an RF transistor 208 in accordance with various embodiments of the present invention. The circuit 200 may have components similar to those described above with respect to circuit 100. However, circuit 200 further includes a compensating device 256 that may be integrated to compensate pinch-off voltage variation over process that could otherwise compromise an ability of an uncompensated bias network relying on a D-FET as transistor 228 to accurately bias the RF transistor 208. In some embodiments, the compensating device may be a current source.

The compensating device 256 may be a shunt current source that is coupled in parallel with current mirror 236. The compensating device 256 may be constructed from a process similar to that of transistor 228. For example, if the transistor 228 is a triple-gate D-FET, the compensating device 256 may be also be a multi-gate D-FET. Therefore, any pinch-off voltage variation experienced by transistor 228 will also be experienced by compensating device 256. By coupling the compensating device 256 in parallel with the current mirror 236, the effect of the pinch-off voltage variation experienced by transistor 228 will be at least partially compensated by the shunt compensating device 256. For example, if the dVp of the transistor 228 increases, the base-emitter voltage of the RF transistor 208 may go down and, therefore, Iccq may decrease. However, because the compensating device 256 is made of the same process as transistor 228, the compensating device 256 will also have a larger dVp. This may force more current to flow into the current mirror 236 and, consequently, more current may be pushed into the RF transistor 208. Therefore, the compensating device 256 may at least partially compensate for process variation with respect to the transistor 228. Similar considerations are valid if dVp decreases as a result of process variations as well.

In such a manner, the bias network 204 may increase the usable control voltage, with respect to previous bias networks, and, in addition, compensate for process variation dependence that may occur through use of a D-FET as a current source.

Figure 3:
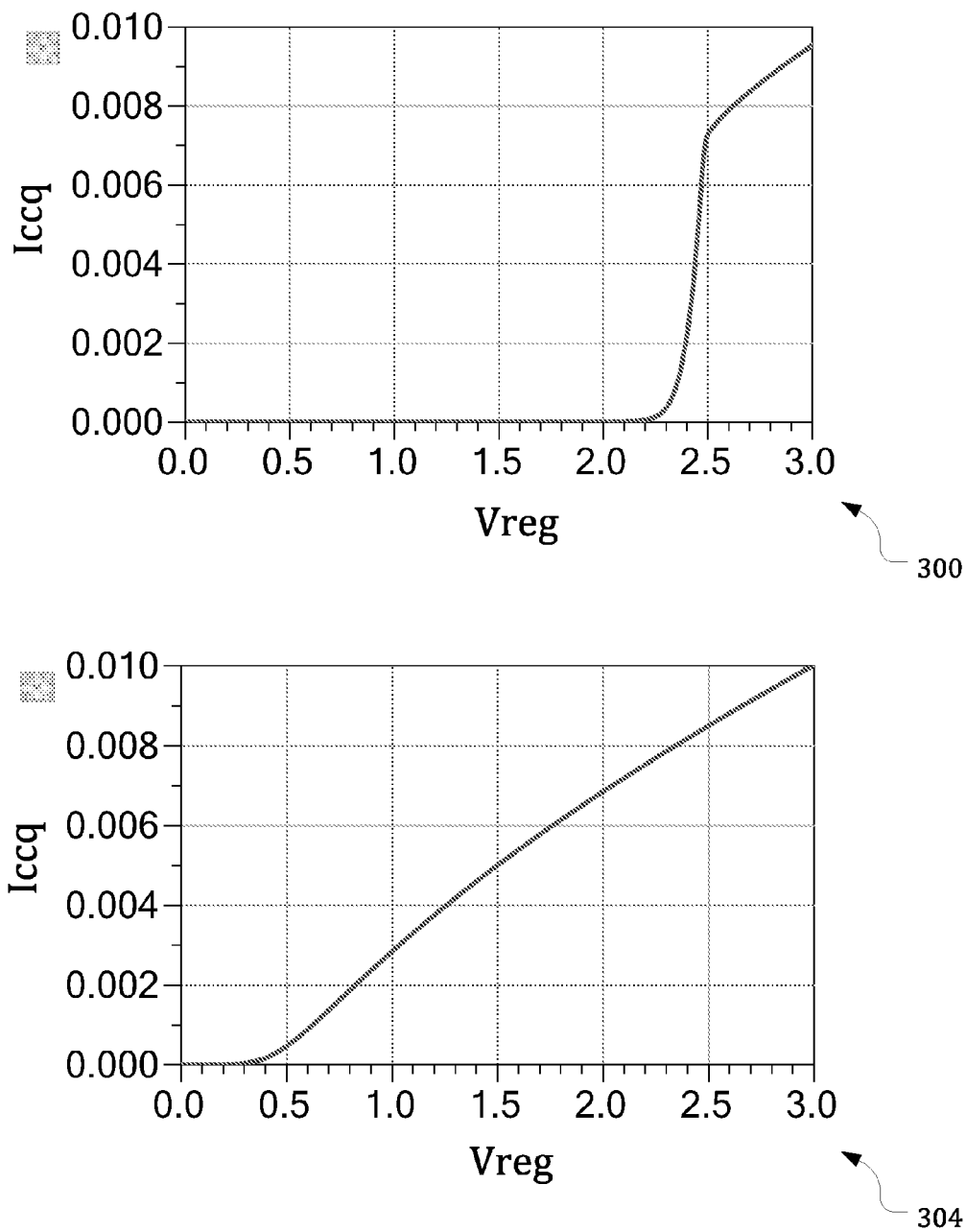
FIG. 3 illustrates charts depicting quiescent bias performance of bias networks in accordance with various embodiments.

FIG. 3 illustrates charts 300 and 304 depicting the quiescent bias performance over Vreg of various bias networks. In particular, the chart 300 depicts performances of a bias network having an HBT emitter follower and chart 304 depicts performances of a bias network having a triple-gate D-FET, for example, bias network 200, in accordance with embodiments of the present invention.

As previously mentioned, Vreg may be provided by a DAC with an accuracy of ±100 mV. To provide accurate control, Vreg of the bias network corresponding to chart 300 will need to be above 2.5 V. Otherwise, variations in Vreg within understood accuracy tolerances may result in an unacceptably large variation in Iccq. On the other hand, the Vreg of the bias network corresponding to chart 304 may be set anywhere from approximately 0.6 V-3.0 V with acceptable Iccq variations. Therefore, bias networks utilizing triple-gate D-FETs as described in various embodiments may allow for a larger usable range of Vreg, which may, in turn, result in more accurate biasing of an associated RF transistor.

Figure 4:
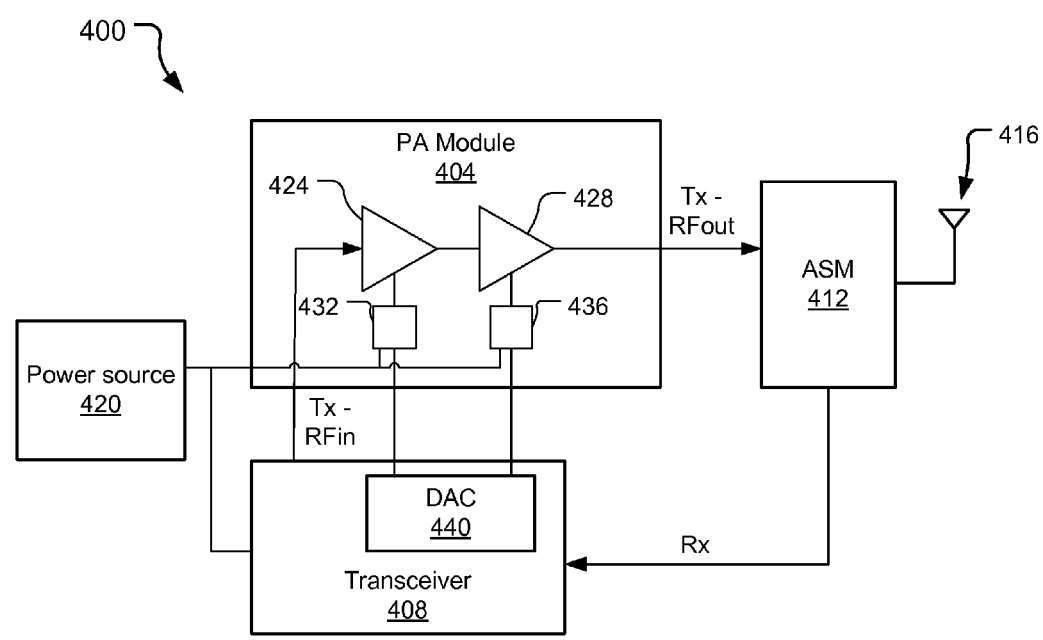
FIG. 4 is a system including a bias network and power amplifier in accordance with various embodiments.

Embodiments of bias networks described herein, and apparatuses including such bias networks, may be incorporated into various other apparatuses and systems. A block diagram of an example system 400 is illustrated in FIG. 4. As illustrated, the system 400 includes a power amplifier (PA) module 404, a transceiver 408, and antenna switch module (ASM) 412, an antenna 416, and a power source 420 coupled with each other at least as shown.

The PA module 404 may include a multistage power amplifier having a first stage PA 424 and a second stage PA 428. In other embodiments, the power amplifier module may include more or less stages. The first stage PA 424 may be coupled with a bias network 432 and the second stage PA 428 may be coupled with a bias network 436. The bias networks 432 and 436 may each be coupled to the power source 420, which may provide Vbatt to the networks, and may further be coupled with a DAC 440 in the transceiver 408, which may provide Vreg to the networks. The bias networks 432 or 436 may be similar to bias networks 104 or 204 described above. Thus, the bias networks 432 or 436 may provide accurate Iccq biasing over a relatively large control voltage range and, in some embodiments, also include process variation compensation.

The PA module 404 may receive an RF input signal, RFin, from the transceiver 408. The PA module 404 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 4.

The amplified RF output signal, RFout, may be provided to the ASM 412, which effectuates an over-the-air (OTA) transmission of the RF output signal, RFout, via the antenna 416. The ASM 412 may also receive RF signals via the antenna 416 and couple the received RF signals, Rx, to the transceiver 408 along a receive chain. While not shown, the receive chain may include, for example, filters, low noise amplifiers, etc.

In various embodiments, the antenna 416 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 400 may be any system including power amplification. In various embodiments, the system 400 may be particularly useful for power amplification at high radio frequency power and frequency. For example, the system 400 may be suitable for any one or more of terrestrial and satellite communications, radar systems, and possibly in various industrial and medical applications. More specifically, in various embodiments, the system 400 may be a selected one of a radar device, a satellite communication device, a mobile handset, a cellular telephone base station, a broadcast radio, or a television amplifier system.

Various examples of embodiments of the present disclosure are provided below.

Example 1 includes a circuit comprising: a radio frequency (RF) transistor; and a bias network coupled with a base of the RF transistor, the bias network including: a multi-gate depletion mode field effect transistor (D-FET) to provide a quiescent current; and a current mirror that includes a heterojunction bipolar transistor (HBT) to provide a mirror current, wherein the quiescent current is proportional to the mirror current.

Example 2 includes the circuit of example 1, wherein the multi-gate D-FET is a first multi-gate D-FET and the circuit further comprises: a current source that includes a second multi-gate D-FET that is coupled in parallel with the HBT.

Example 3 includes the circuit of example 2, wherein the current source is a shunt current source.

Example 4 includes the circuit of example 2, wherein the current source is to at least partially compensate process variation with respect to the first multi-gate D-FET.

Example 5 includes the circuit of any of examples 1-4, wherein the bias network is to be coupled with a digital-to-analog converter (DAC) to provide a regulator voltage (Vreg) that is between approximately 0.7 volts (V) and 2.9 V.

Example 6 includes the circuit of example 5, wherein the DAC is to provide the regulator voltage below 2.5 V.

Example 7 includes the circuit of any of examples 1-6, wherein the RF transistor is a drive stage of a power amplifier.

Example 8 includes the circuit of any of examples 1-6, wherein the RF transistor is a final stage of a power amplifier.

Example 9 includes the circuit of any of examples 1-8, wherein the multi-gate D-FET is a triple-gate D-FET.

Example 10 includes a circuit comprising: a radio frequency (RF) transistor; and a bias network including: a first branch having: a terminal to receive a battery voltage; a multi-gate depletion mode field effect transistor (D-FET) coupled with the terminal; and a node coupled with a base of the RF transistor; and a second branch having: a terminal to receive a regulator voltage; a heterojunction bipolar transistor (HBT) having a base coupled with the node of the first branch; and a capacitor coupled with the base of the HBT and a collector of the HBT.

Example 11 includes the circuit of example 10, wherein the first branch further comprises a capacitor coupled with the node and ground.

Example 12 includes the circuit of any of examples 10-11, wherein the base of the HBT is coupled with the node through a resistor.

Example 13 includes the circuit of any of examples 10-12, wherein the multi-gate D-FET is a first multi-gate D-FET and the second branch further comprises a second multi-gate D-FET coupled in parallel with the HBT.

Example 14 includes the circuit of any of examples 10-13, wherein the HBT is a current mirror, and the second multi-gate D-FET is a current source.

Example 15 includes the circuit of example 14, wherein the current source is to at least partially compensate process variation with respect to the multi-gate D-FET.

Example 16 includes the circuit of any of examples 10-15, wherein the multi-gate D-FET is a triple-gate D-FET.

Example 17 includes a system comprising: a power source to provide a battery voltage; a transceiver to provide a transmit signal and a regulator voltage; and a power amplifier (PA) module comprising: a power amplifier stage coupled with the transceiver to receive and amplify the transmit signal; and a bias network coupled with the power amplifier stage, the power source, and the transceiver, the bias network including a multi-gate depletion mode field effect transistor (D-FET) to provide a quiescent current to the power amplifier stage based on the regulator voltage.

Example 18 includes system of example 17, wherein the bias network further includes a heterojunction bipolar transistor (HBT) to provide a mirror current based on the quiescent current to set the quiescent current through the power amplifier stage.

Example 19 includes the system of example 18, wherein the bias network further includes a multi-gate D-FET current source coupled in parallel with the HBT to at least partially compensate process variation with respect to the multi-gate D-FET.

Example 20 includes the system of any of examples 17-19, wherein the transceiver includes a digital-to-analog converter (DAC) to provide the regulator voltage with a range of approximately 2.2 V.

Example 21 includes the system of any of examples 17-20, wherein the system is a mobile computing device.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A circuit comprising:
   a radio frequency (RF) transistor; and
   a bias network coupled with a base of the RF transistor, the bias network including:
      a multi-gate depletion-mode field-effect transistor (D-FET) to provide a quiescent current, wherein the multi-gate D-FET is a triple-gate D-FET; and
      a current mirror that includes a heterojunction bipolar transistor (HBT) to provide a mirrored current, wherein the quiescent current is proportional to the mirror current.

2. The circuit of claim 1, wherein the multi-gate D-FET is a first multi-gate D-FET and the circuit further comprising:
   a current source that includes a second multi-gate D-FET that is coupled in parallel with the HBT.

3. The circuit of claim 2, wherein the current source is a shunt current source.

4. The circuit of claim 2, wherein the current source is to at least partially compensate process variation with respect to the first multi-gate D-FET.

5. The circuit of claim 1, wherein the bias network is to be coupled with a digital-to-analog converter (DAC) to provide a regulator voltage (Vreg) that is between approximately 0.7 volts (V) and 2.9 V.

6. The circuit of claim 5, wherein the DAC is to provide the regulator voltage below 2.5 V.

7. The circuit of claim 1, wherein the RF transistor is a drive stage of a power amplifier.

8. The circuit of claim 1, wherein the RF transistor is a final stage of a power amplifier.

9. The circuit of claim 1, further comprising a capacitor coupled with the base of the HBT and a collector of the HBT.

10. A circuit comprising:
    a radio frequency (RF) transistor; and
    a bias network including:
       a first branch having:
          a terminal to receive a battery voltage;
          a multi-gate depletion mode field effect transistor (D-FET) coupled with the terminal; and
          a node coupled with a base of the RF transistor; and
       a second branch having:
          a terminal to receive a regulator voltage;
          a heterojunction bipolar transistor (HBT) having a base coupled with the node of the first branch; and
          a capacitor coupled with the base of the HBT and a collector of the HBT.

11. The circuit of claim 10, wherein the first branch further comprises a capacitor coupled with the node and ground.

12. The circuit of claim 10, wherein the base of the HBT is coupled with the node through a resistor.

13. The circuit of claim 10, wherein the multi-gate D-FET is a first multi-gate D-FET and the second branch further comprises a second multi-gate D-FET coupled in parallel with the HBT.

14. The circuit of claim 13, wherein the HBT is a current mirror, and the second multi-gate D-FET is a current source.

15. The circuit of claim 14, wherein the current source is to at least partially compensate process variation with respect to the multi-gate D-FET.

16. The circuit of claim 10, wherein the multi-gate D-FET is a triple-gate D-FET.

17. A system comprising:
    a power source to provide a battery voltage;
    a transceiver to provide a transmit signal and a regulator voltage; and
    a power amplifier (PA) module comprising:
       a power amplifier stage coupled with the transceiver to receive and amplify the transmit signal; and
       a bias network coupled with the power amplifier stage, the power source, and the transceiver, the bias network including a multi-gate depletion mode field effect transistor (D-FET) to provide a quiescent current to the power amplifier stage based on the regulator voltage, wherein the multi-gate D-FET is a triple-gate D-FET.

18. The system of claim 17, wherein the bias network further includes a heterojunction bipolar transistor (HBT) to provide a mirror current to set the quiescent current through the power amplifier stage.

19. The system of claim 18, wherein the bias network further includes a multi-gate (D-FET) current source coupled in parallel with the HBT to at least partially compensate process variation with respect to the multi-gate D-FET.

20. The system of claim 17, wherein the transceiver includes a digital-to-analog converter (DAC) to provide the regulator voltage with a range of approximately 2.2 V.

21. The system of claim 17, wherein the system is a mobile computing device.

22. The system of claim 18, further comprising a capacitor coupled with the base of the HBT and a collector of the HBT.

* * * * *